(12) United States Patent
Kwak et al.

(10) Patent No.: US 6,391,715 B1
(45) Date of Patent: May 21, 2002

(54) METHOD FOR FORMING A CAPACITOR

(75) Inventors: Sun-Woo Kwak; Jung-Hun Yun; Byung-Su Koo; Su-Young Kwon, all of Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/697,515

(22) Filed: Oct. 27, 2000

(30) Foreign Application Priority Data

Oct. 29, 1999 (KR) .......................................... 99-47489

(51) Int. Cl.⁷ .......................................... H01L 21/8242
(52) U.S. Cl. ........................ 438/255; 438/253; 438/396; 438/398
(58) Field of Search ................................ 438/255, 239, 438/253, 254, 396, 398, 964

(56) References Cited

U.S. PATENT DOCUMENTS

| | | | |
|---|---|---|---|
| 4,943,344 A | * 7/1990 | Tachi et al. .................. | 438/715 |
| 5,629,043 A | * 5/1997 | Inaba et al. .................... | 427/79 |
| 5,639,685 A | * 6/1997 | Zahurak et al. ............. | 438/658 |
| 5,798,280 A | 8/1998 | Mathews et al. | |
| 5,858,852 A | 1/1999 | Aiso et al. | |
| 5,909,625 A | 6/1999 | Lim | |
| 5,933,727 A | 8/1999 | Figura | |
| 5,989,973 A | * 11/1999 | Zahurak et al. ............. | 438/398 |
| 6,015,743 A | * 1/2000 | Zahurak et al. ............. | 438/398 |
| 6,130,451 A | * 10/2000 | Hasegawa .................... | 257/310 |

* cited by examiner

Primary Examiner—Keith Christianson
Assistant Examiner—Jack Chen
(74) Attorney, Agent, or Firm—Volentine Francos, PLLC

(57) ABSTRACT

The present invention relates to a method for fabricating a capacitor of a semiconductor device to prevent an occurrence of an operational failure of a capacitor caused by the cleaning steps that follow the process of doping $PH_3$ into an HSG. This improves the quality of the fabricated capacitor and simplifies the operational processes of manufacture. The method includes the steps of forming an insulating interlayer over a semiconductor substrate, forming a buried contact hole in the insulating interlayer to expose a predetermined portion of the semiconductor substrate, forming a lower electrode over the insulating interlayer and in the buried contact hole, performing a first cleaning process, growing an HSG on an exposed portion of the lower electrode, performing a second cleaning process, doping $PH_3$ into the HSG, and forming a dielectric layer over the HSG and the lower electrode. These last two steps, and in some cases the last three steps, are performed in a single process chamber without breaking up of a vacuum state of a process chamber.

3 Claims, 4 Drawing Sheets

METHOD FOR FORMING A CAPACITOR

This application relies for priority upon Korean Patent Application No. 99-47489, filed on Oct. 29, 1999, the contents of which are herein incorporated by reference in their entirety.

BACKGROUND OF THE INVENTION

The present invention relates to a method for fabricating a semiconductor device. More particularly, the present invention relates to a method for fabricating a capacitor of a semiconductor device that can prevent an occurrence of operational failure caused by a cleaning process, and can simplify the operational processes when the capacitor is fabricated by the application of a hemispherical grain (hereinafter referred to as HSG).

In accordance with a general trend of high integration in semiconductor devices, continuous efforts have been made to decrease a region occupied by a capacitor in an identical area of the device, while simultaneously securing its large capacitance. This will allow a reduction in the size of a chip with large memory capacity. Currently, semiconductor devices are being fabricated using a method in which an HSG process is performed to maximize the effective area for DRAM capacitors, while minimizing it's actual area.

FIG. 1 is a cross-sectional view illustrating a capacitor fabricated by a conventional method. With reference to FIG. 1, the capacitor is constructed in a deposition structure sequentially comprising: a semiconductor substrate 10, an insulating interlayer 20, a lower electrode 30, an HSG 40, a dielectric layer 50, and an upper electrode 60.

The insulating interlayer 20 is formed on the semiconductor substrate 10, and has a buried contact hole (h) formed in it. The lower electrode 30 is formed on the insulating interlayer 20 and in the contact hole (h). The HSG 40 is formed on the lower electrode 30, and the dielectric layer 50 is formed on the HSG 40 and the lower electrode 30 to separate them from the upper electrode.

The capacitor described above is fabricated as shown in the operational block diagram of FIG. 2 as follows.

An insulating interlayer 20 is initially formed on a semiconductor substrate 10 (step 100).

A buried contact hole (h) is them formed in the insulating interlayer 20 (step 105). This is accomplished by forming a mask pattern (not shown) on the insulating layer 20 to restrict a lower electrode forming part, and using the mask pattern to etch the insulating interlayer 20 to expose a predetermined portion of the surface of the substrate 10.

An electrode material, e.g., a high density P-type impurity, is then doped into the exposed surface of the substrate 10 and insulating interlayer 20 to form an amorphous polysilicon layer (step 110). This is done to fill up the inner portion of the contact hole (h). After this, another mask pattern that restricts a lower electrode forming part is applied to selectively etch the polysilicon layer. As a result of this, the polysilicon lower electrode 30 is formed over a predetermined portion of the insulating interlayer 20 and in the contact hole (h).

A first cleaning process is then performed to eliminate all of the particles (e.g., contaminants like natural oxide layer) remaining on the resultant structure, including the completely formed lower electrode 30 (step 115).

An HSG 40 is then selectively grown on the exposed surface of the lower electrode 30 to maximize an area of the capacitor (step 120).

Then, a second cleaning process is performed to eliminate all of the particles remaining on the resultant structure after the HSG 40 is formed (step 125).

In order to increase the surface density of the HSG 40, a $PH_3$ impurity is then doped into the HSG 106 for about 180 minutes under an operational condition of "high temperature and low pressure" (step 130).

Next, a third cleaning process is performed to eliminate all of the particles remaining on the resultant structure after the $PH_3$ doping is completed (step 135).

A dielectric layer 50 is then deposited onto the insulating interlayer 20, the lower electrode 30, and the HSG 40 (step 140).

Then, a doped amorphous polysilicon layer is formed on the dielectric layer 50, to be used as an upper electrode (step 145). The doped amorphous polysilicon layer is preferably doped with a high density P-type impurity. The doped amorphous polysilicon layer is then selectively etched using a mask pattern that restricts an upper electrode forming part to thereby form the polysilicon lower electrode 60. In this way all of the operational processes for fabricating the capacitor are performed.

However, if a capacitor is fabricated by the aforementioned method, a problem arises. The processes for doping $PH_3$ and forming the dielectric layer should be separately performed in different chambers or facilities, followed by cleaning steps after the completion of each level of the fabricating processes. This can substantially complicate all the fabrication processes.

Furthermore, as the integration of a semiconductor device increases, the cell area decreases and so the gap between lower electrodes decreases. In the third cleaning process, after the $PH_3$ doping, a part of the silicon lumps stuck onto the lower electrode 30 by the HSG process may fall off the surface of the lower electrode 30 onto the insulating interlayer 20 formed between two capacitors. If this happens, the fallen silicon lump can form a bridge between two capacitors, which can bring about the operational failure of the two capacitors. As a result of this, there has been an urgent demand to solve the aforementioned problems.

SUMMARY OF THE INVENTION

Therefore, it is an object of the present invention to solve the problems set forth above and to provide a method for fabricating a capacitor of a semiconductor device, in which processes for doping $PH_3$ and forming a dielectric layer followed by growth of HSG are continuously performed in a sheet fed chamber without breaking up the chamber's its vacuum state. This is done to insure that there will be no occurrence of an operational failure resulting from the cleaning step that follows the process of doping $PH_3$. As a result, this prevents an operational failure of the capacitor and simplifies the processes of fabricating the capacitor.

In order to accomplish the aforementioned object, a method is provided in accordance with an embodiment of the present invention comprising forming an insulating interlayer over a semiconductor substrate; forming a buried contact hole in the insulating layer to expose a predetermined portion of the semiconductor substrate; forming a lower electrode over the insulating interlayer and in the buried contact hole; performing a first cleaning process on the insulating layer and lower electrode; growing a hemispherical grain (HSG) on an exposed portion of the lower electrode; performing a second cleaning process on the lower electrode and the HSG; doping an impurity into the HSG; and forming a dielectric layer over HSG and the lower electrode. The doping of an impurity into the HSG and the forming of a dielectric layer are performed in a single process chamber without breaking up of a vacuum state of the chamber.

The impurity is preferably $PH_3$. The chamber is preferably a sheet fed chamber. The method for fabricating a capacitor may further comprise forming an upper electrode over the dielectric layer.

In order to accomplish the aforementioned object, there is also provided a method in accordance with another embodiment of the present invention comprising forming an insulating interlayer over a semiconductor substrate; forming a buried contact hole in the insulating layer that exposes a predetermined portion of the semiconductor substrate; forming a lower electrode over the insulating interlayer and in the buried contact hole; performing a cleaning process on the lower electrode and the insulating interlayer; growing a hemispherical grain (HSG) on an exposed portion of the lower electrode; doping an impurity into the HSG; and forming a dielectric layer over the HSG and the lower electrode. The growing of the HSG, the doping of an impurity into the HSG, and the forming of a dielectric layer are performed in a single process chamber without breaking up of a vacuum state of the chamber.

The impurity is preferably $PH_3$. The chamber is preferably a sheet fed chamber. The method for fabricating a capacitor may further comprise forming an upper electrode over the dielectric layer.

If a capacitor is fabricated by the methods noted above, the processes of doping with $PH_3$ and forming a dielectric layer are continuously carried out without breakup of the vacuum state. As a result, compared with the conventional method, one or two cleaning steps are omitted, which simplifies the processes of fabricating a capacitor.

Furthermore, no separate cleaning step is required after the process of doping $PH_3$, which eliminates the possibility of operational failure caused by such a cleaning process.

BRIEF DESCRIPTION OF THE DRAWINGS

Objects and aspects of the invention will become apparent from the following description of embodiments with reference to the accompanying drawings in which.

DETAILED DESCRIPTION OF THE PRESENT INVENTION

Objects and aspects of the present invention will become apparent from the following detailed description of preferred embodiments with reference to the accompanying drawings.

Figure 1:
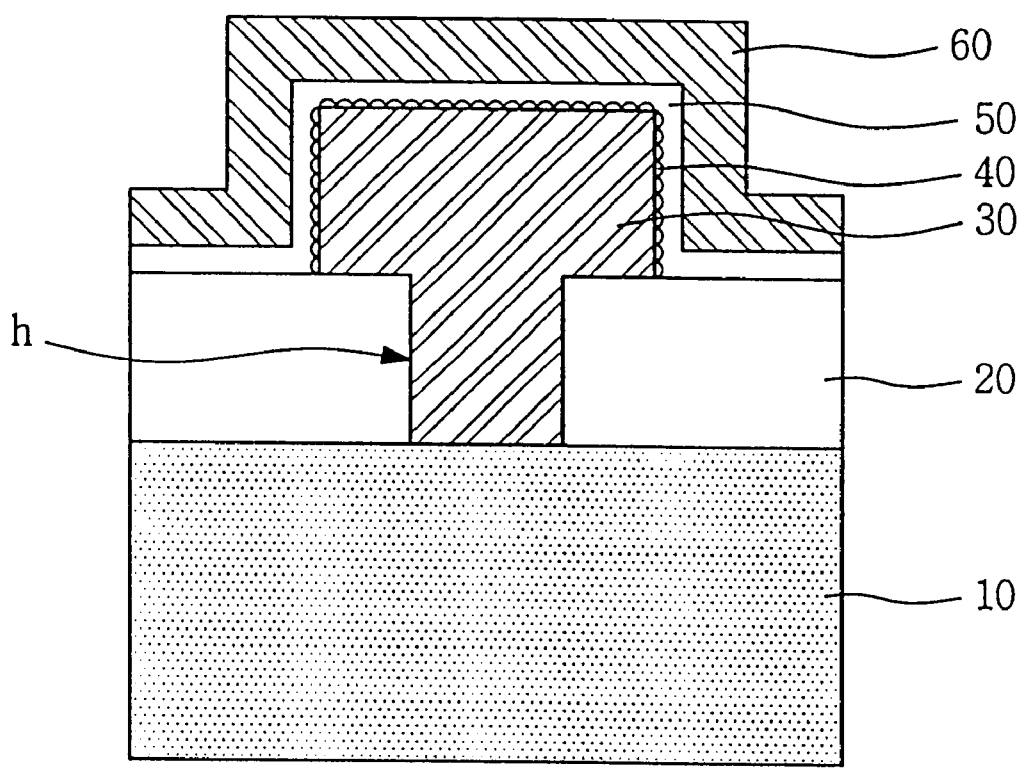
FIG. 1 is a cross-sectional view illustrating the structure of a general DRAM capacitor of a semiconductor device.
Figure 2:
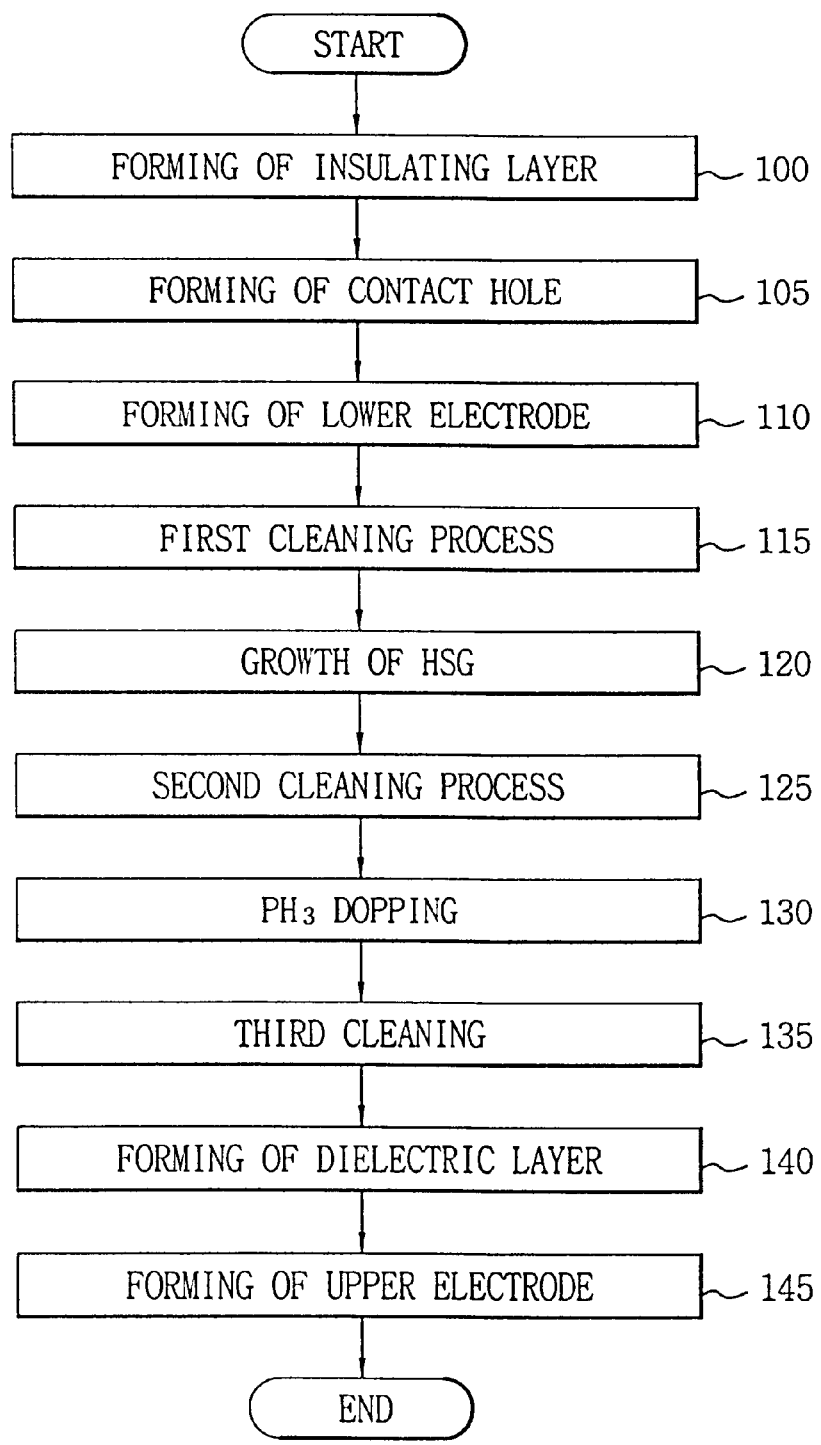
FIG. 2 is an operational block diagram illustrating a conventional method for fabricating the capacitor shown in FIG. 1.
Figure 3:
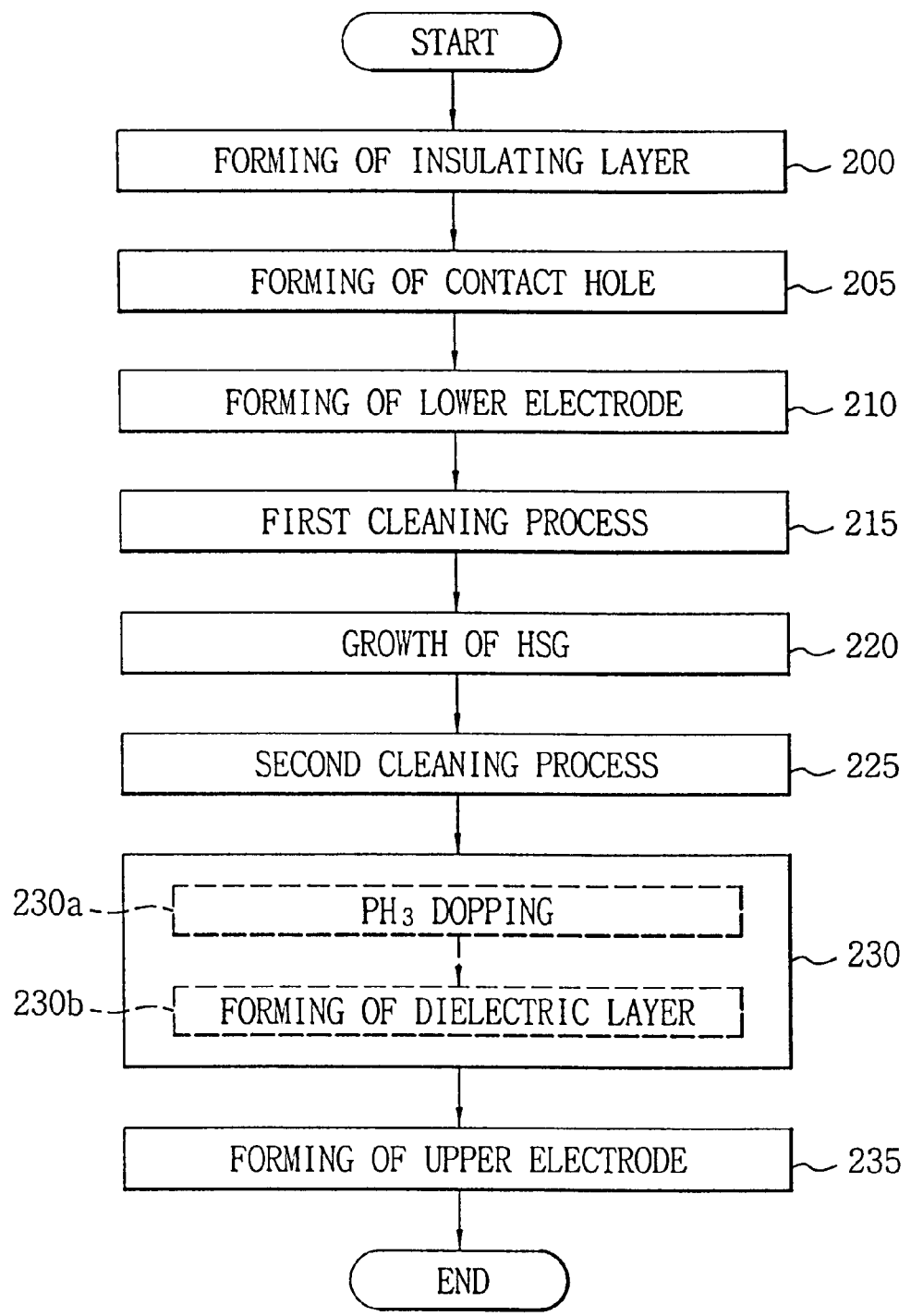
FIG. 3 is an operational block diagram illustrating a method for fabricating the capacitor shown in FIG. 1 in accordance with a first preferred embodiment of the present invention.

FIG. 3 is an operational block diagram illustrating a method for fabricating a capacitor of a semiconductor device in accordance with a first preferred embodiment of the present invention. With reference to the structure of the capacitor shown in FIG. 1 and the operational block diagram shown in FIG. 3, the method for fabricating a capacitor in accordance with the first preferred embodiment of the present invention will be divided into eight steps as follows.

In the first step, an insulating interlayer 20 of an oxide layer is formed over a semiconductor substrate 10 (step 200).

Then, a mask pattern restricting a lower electrode forming part is formed over the insulating insulator 20, and is used to etch the insulating interlayer 20 to expose a predetermined portion of the surface of the substrate 10, Next, a buried contact hole (h) is formed in the insulating interlayer 20 (step 205). This is preferably accomplished by forming a mask pattern that defines a lower electrode forming part over the insulating insulator 20, and using the mask pattern to etch the insulating interlayer 20 to expose a predetermined portion of the surface of the substrate 10.

In the third step, a lower electrode is formed (step 210). In this process, an electrode material, e.g., a polysilicon layer doped with a high density P-type impurity, is deposited over the insulating layer and filling the buried contact hole (h) doped to form a polysilicon layer. Then, another mask pattern that defines a lower electrode is applied to selectively etch the polysilicon layer. As a result, the polysilicon lower electrode 30 is formed over a predetermined portion of the insulating interlayer 20, namely the portion having the contact hole (h).

A first cleaning process is then performed to eliminate all particles remaining on the interlayer insulating layer 20 or the lower electrode 30 (step 215). Such contaminants could include materials like a natural oxide layer.

In the fifth step, an HSG 40 is selectively grown on the exposed surface of the lower electrode 30 to maximize an area of the resulting capacitor (step 220).

After HSG formation, a second cleaning process is performed to eliminate all of the particles remaining on the interlayer insulating layer 20, the lower electrode 30, or the HSG 40 (step 225).

Then, in order to increase the surface density of HSG, a two part process (sub-step 230) is performed sequentially doping the HSG with a $PH_3$ impurity (sub-step 230a) and forming a dielectric layer 50 (step 230b). These two parts (sub-steps 230a and 230b) are preferably carried out using a sheet fed apparatus in an identical process chamber (also referred to as a sheet fed chamber) without breaking up of its vacuum state.

Finally, a polysilicon upper electrode 60 is formed over the dielectric layer 50 (step 235). Preferably this is accomplished by depositing a polysilicon layer doped with a high density P-type impurity over the dielectric layer 50, and using a mask pattern defining an upper electrode to selectively etch the polysilicon and dielectric layers.

After this eighth and final step, all of-the operational processes for fabricating the capacitor have been completed.

If a capacitor is fabricated in accordance with the first preferred embodiment of the present invention, the processes of doping $PH_3$ and forming the dielectric layer 50, which follows the growth of the HSG 40, can be sequentially performed in the sheet fed chamber without a breakup of its vacuum state. As a result, there will be no growth of a natural oxide layer after the doping of the $PH_3$, and so a separate cleaning step is not required.

Accordingly, since there is no cleaning step following the $PH_3$ doping, there will also be no occurrence of an operational failure (caused, for instance, by silicon lumps of HSG falling and getting stuck between capacitors) resulting from such a cleaning step. As a result, this process can prevent an operational failure of a capacitor that results from the formation of a bridge between capacitors.

In addition, in comparison with the conventional method for fabricating a capacitor, one cleaning step is omitted, which makes the fabrication processes less complicated.

Figure 4:
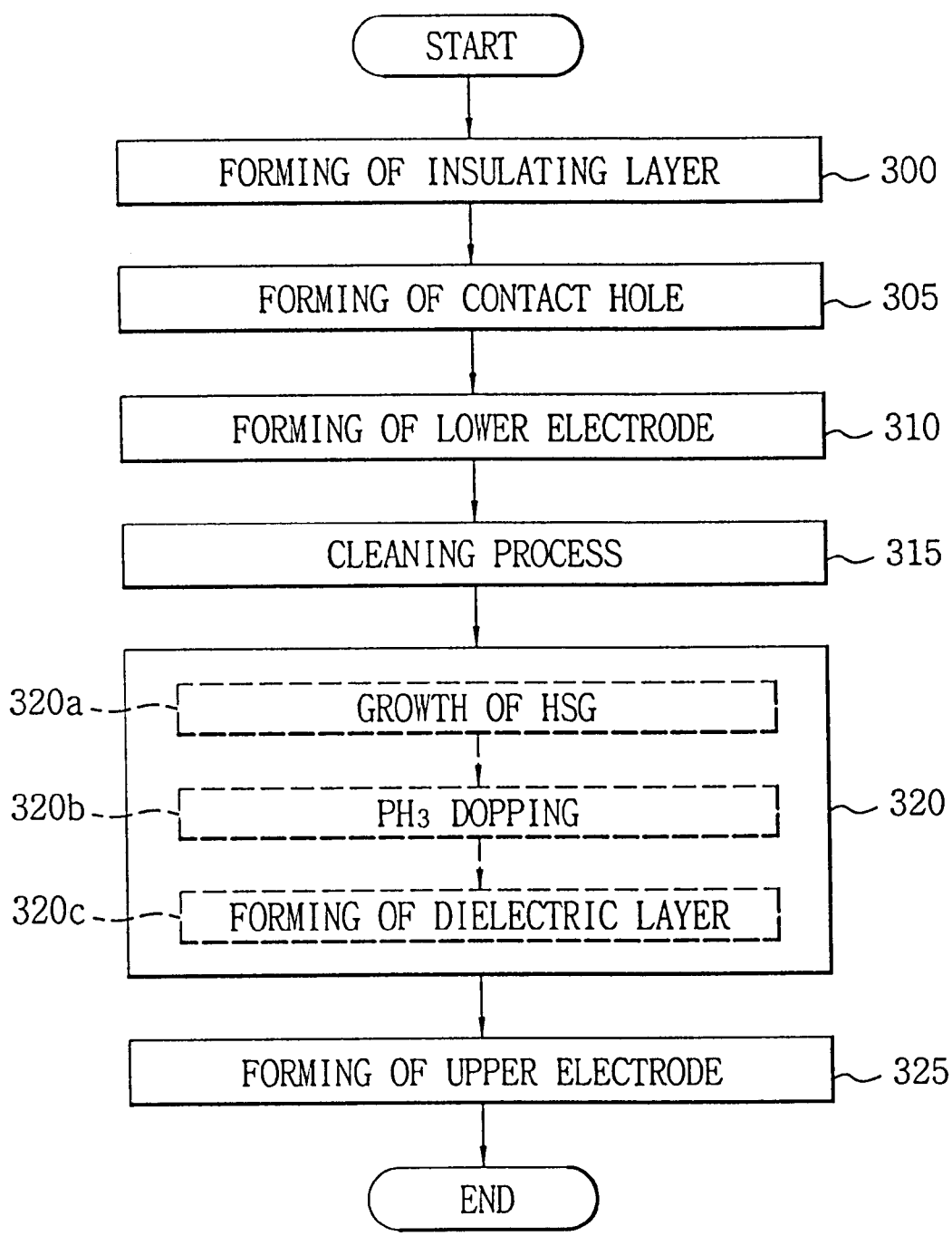
FIG. 4 is an operational block diagram illustrating a method for fabricating the capacitor shown in FIG. 1 in accordance with a second preferred embodiment of the present invention.

FIG. 4 is an operational block diagram illustrating a capacitor of a semiconductor device in accordance with a second preferred embodiment of the present invention. With reference to the structure of a capacitor shown in FIG. 1 and the operational block diagram shown in FIG. 4, the method for fabricating a capacitor in accordance with the second embodiment of the present invention will be divided into six steps as described below.

In comparison with the first preferred embodiment of the present invention, the second preferred embodiment of the present invention differs in that all the processes of growing the HSG, doping $PH_3$, and forming a dielectric layer are sequentially performed in a the process chamber without breaking its vacuum state. Therefore, for the convenience of the disclosure, only brief description will be provided regarding the processes that are identical to those in the first preferred embodiment; only the processes that differ from those in the first preferred embodiment will be described in detail.

Initially, an insulating interlayer 20 of an oxide layer is formed over the semiconductor substrate 10 (step 300).

Next, a buried contact hole (h) is formed in the insulating interlayer 20 (step 305).

A polysilicon lower electrode 30 is then formed at a predetermined portion over the insulating interlayer 20 and in the buried contact hole (h) (step 310).

Then, a cleaning process is performed to eliminate all of the particles (e.g., contaminants like a natural oxide layer) remaining on the insulating layer 20 and the lower electrode 30 (step 315).

In the fifth step (step 320), a three part process is performed. An HSG 40 is initially grown on an exposed surface of the lower electrode 30 in the sheet fed chamber (sub-step 320a); then the HSG is doped with a $PH_3$ impurity (sub-step 320b); and then a dielectric layer 50 is formed over the doped HSG 40 (sub-step 320c). Each of these sub-steps is preferably carried out sequentially without a breakup of the vacuum state in the process chamber.

Finally, polysilicon upper electrode 60 is formed (step 325). In this step, a polysilicon layer, preferably doped with a high density P-type impurity, is formed over the dielectric layer 50. A mask pattern that defines an upper electrode is then used to selectively etch the polysilicon and dielectric layers, thereby forming the polysilicon upper electrode 60.

At this point, all the operational processes for fabricating the capacitor have been completed.

If a capacitor is fabricated in accordance with the second preferred embodiment of the present invention, the processes of growing the HSG 40, doping $PH_3$, and forming the dielectric layer 50 can be sequentially performed in the sheet fed chamber without breaking up its vacuum state. As a result, there will be no need for separate cleaning steps. Between each of these processed. Therefore, there will be no operational failure of a capacitor caused by such cleaning steps. In addition, as compared with the conventional method for fabricating a capacitor, two cleaning steps are omitted, which further simplifies the fabrication process.

As described above, there are advantages in the methods for fabricating a capacitor according to the preferred embodiments of the present invention in various processes of doping $PH_3$ and forming the dielectric layer to be followed by growth of the HSG can be sequentially performed in the sheet fed chamber without breaking up its vacuum state. This prevents an occurrence of an operational failure of a capacitor caused by the cleaning steps that follow the processes of doping $PH_3$, and simplifies the operational processes by skipping one or two cleaning steps while fabricating a capacitor of a semiconductor device.

What is claimed is:

1. A method for fabricating a capacitor of a semiconductor device, comprising:
    forming an insulating interlayer over a semiconductor substrate;
    forming a buried contact hole in the insulating interlayer to expose a portion of the semiconductor substrate;
    forming a lower electrode over the insulating interlayer and in the buried contact hole;
    performing a first cleaning process on the insulating interlayer and lower electrode;
    growing a hemispherical grain (HSG) on an exposed portion of the lower electrode;
    performing a second cleaning process on the lower electrode and the HSG;
    doping an impurity into the HSG; and
    forming a dielectric layer over HSG and the lower electrode,
    wherein the doping of an impurity into the HSG and the forming of a dielectric layer are performed in a single process chamber without breaking up of a vacuum state of the chamber.

2. A method for fabricating a capacitor of a semiconductor device, as recited in claim 1, wherein the impurity is $PH_3$.

3. A method for fabricating a capacitor of a semiconductor device, as recited in claim 1, further comprising forming an upper electrode over the dielectric layer.

* * * * *